United States Patent
Tosaka et al.

(10) Patent No.: US 11,485,848 B2
(45) Date of Patent: Nov. 1, 2022

(54) NCF FOR PRESSURE MOUNTING, CURED PRODUCT THEREOF, AND SEMICONDUCTOR DEVICE INCLUDING SAME

(71) Applicant: NAMICS CORPORATION, Niigata (JP)

(72) Inventors: Kenichi Tosaka, Niigata (JP); Yoshihide Fukuhara, Niigata (JP); Hiromi Saito, Niigata (JP); Toyokazu Hotchi, Niigata (JP); Masaaki Hoshiyama, Niigata (JP)

(73) Assignee: NAMICS CORPORATION, Niigata (JP)

( * ) Notice: Subject to any disclaimer, the term of this patent is extended or adjusted under 35 U.S.C. 154(b) by 266 days.

(21) Appl. No.: 16/623,447

(22) PCT Filed: Jun. 12, 2018

(86) PCT No.: PCT/JP2018/022390
§ 371 (c)(1),
(2) Date: Dec. 17, 2019

(87) PCT Pub. No.: WO2019/012892
PCT Pub. Date: Jan. 17, 2019

(65) Prior Publication Data
US 2020/0207977 A1    Jul. 2, 2020

(30) Foreign Application Priority Data
Jul. 14, 2017    (JP) .............................. JP2017-137794

(51) Int. Cl.
*C08L 63/00* (2006.01)
*C08G 59/50* (2006.01)
*H01L 23/29* (2006.01)

(52) U.S. Cl.
CPC ............ *C08L 63/00* (2013.01); *C08G 59/504* (2013.01); *C08G 59/5033* (2013.01); *H01L 23/295* (2013.01); *C08L 2203/16* (2013.01); *C08L 2203/206* (2013.01)

(58) Field of Classification Search
CPC ................................ C08L 63/00; C08G 59/50
USPC ................................. 524/493, 47
See application file for complete search history.

(56) References Cited

U.S. PATENT DOCUMENTS

| | | | |
|---|---|---|---|
| 6,787,606 | B1 | 9/2004 | Chen |
| 2006/0217499 | A1* | 9/2006 | Takenaka ................ H01L 24/31 523/205 |
| 2013/0245161 | A1 | 9/2013 | Hsieh et al. |
| 2014/0242757 | A1 | 8/2014 | Yoko et al. |

FOREIGN PATENT DOCUMENTS

| | | | | |
|---|---|---|---|---|
| EP | 2881979 A1 * | 6/2015 | ....... | H01L 21/76841 |
| JP | 2006-143775 A | 6/2006 | | |
| JP | 2011-246596 A | 12/2011 | | |
| JP | 2013-123033 A | 6/2013 | | |
| JP | 2015-503220 A | 1/2015 | | |
| JP | 2016-113525 A | 6/2016 | | |
| WO | WO-2016056619 A1 * | 4/2016 | ............. | C09J 11/06 |
| WO | 2016/148121 A1 | 9/2016 | | |
| WO | WO-2016148121 A1 * | 9/2016 | | |

OTHER PUBLICATIONS

International Search Report dated Sep. 18, 2018, Application No. PCT/JP2018/022390, 4 pages.

* cited by examiner

*Primary Examiner* — Deve V Hall
(74) *Attorney, Agent, or Firm* — Rankin, Hill & Clark LLP

(57) ABSTRACT

There is provided a pre-applied semiconductor sealing film for curing under pressure atmosphere as a non conductive film (NCF) suitable for pressure mounting. This NCF includes (A) a solid epoxy resin, (B) an aromatic amine which is liquid at room temperature and contains at least one of structures represented by formulae 1 and 2 below, (C) a silica filler, and (D) a polymer resin having a mass average molecular weight (Mw) of 6000 to 100000. The epoxy resin of the component (A) has an epoxy equivalent weight of 220 to 340. The component (B) is included in an amount of 6 to 27 parts by mass relative to 100 parts by mass of the component (A). The component (C) is included in an amount of 20 to 65 parts by mass relative to 100 parts by mass in total of the components. A content ratio ((A):(D)) between the component (A) and the component (D) is 99:1 to 65:35. This NCF further has a melt viscosity at 120° C. of 100 Pa·s or less, and has a melt viscosity at 120° C., after heated at 260° C. or more for 5 to 90 seconds, of 200 Pa·s or less.

6 Claims, No Drawings

NCF FOR PRESSURE MOUNTING, CURED PRODUCT THEREOF, AND SEMICONDUCTOR DEVICE INCLUDING SAME

TECHNICAL FIELD

The present invention relates to an NCF for pressure mounting, a cured product of the NCF, and a semiconductor device including the same.

BACKGROUND ART

A flip chip method has been performed for semiconductor mounting. The flip chip method includes placing an integrated circuit (IC) chip and a substrate such that a surface having an electrode (bump) of the integrated circuit (IC) chip faces a surface having an electrode (electrode pad) of the substrate, and electrically connecting the bump of the IC chip and the electrode pad of the substrate.

In this flip chip method, the connected portion between the electrodes is protected from the outside. Furthermore, a stress caused by a difference in a linear expansion coefficient between the IC chip and the substrate is reduced. Therefore, a liquid heat-curable adhesive agent called an underfill is usually poured between a semiconductor chip and a substrate after the connection of electrodes, and cured.

In recent years, IC chips are rapidly becoming finer. Accordingly, a pitch between neighboring electrodes and a gap between a semiconductor chip and a substrate tend to become increasingly narrower. This raises problems. For example, voids occur when an underfill is poured between an IC chip and a substrate by capillarity, or much time is required to pour an underfill.

Therefore, a so-called pre-applied method has been attempted (see PATENT LITERATURE 1). According to this method, a liquid adhesive agent called a non conductive paste (NCP) or a film-like adhesive agent called a non conductive film (NCF) is previously applied or affixed on a substrate. Thereafter, resin is cured by thermal compression bonding (TCB) using a flip chip bonder or the like. In this manner, a bump of an IC chip and an electrode pad of a substrate are connected.

Pressure mounting, which includes heating and mounting under pressure atmosphere, has been proposed as a method for suppressing voids during semiconductor mounting (see PATENT LITERATURE 2 and PATENT LITERATURE 3).

CITATION

Patent Literature

PATENT LITERATURE 1: JP-A-2015-503220
PATENT LITERATURE 2: JP-A-2013-123033
PATENT LITERATURE 3: WO 2016/148121 A

SUMMARY OF THE INVENTION

Problems to be Solved by the Invention

An object of the present invention is to provide: an NCF suitable for pressure mounting, more specifically, an NCF which has a high void suppressing effect when used for pressure mounting; a cured product of the NCF; and a semiconductor device including the NCF.

Solution to the Problems

In order to achieve the object described above, the present invention is a pre-applied semiconductor sealing film for curing under pressure atmosphere which includes: (A) a solid epoxy resin: (B) an aromatic amine which is liquid at room temperature and includes at least one of structures represented by formulae 1 and 2 below;

[Chemical Formula 1]

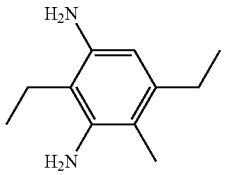

(Formula 1)

[Chemical Formula 2]

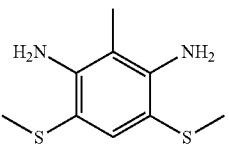

(Formula 2)

(C) a silica filler; and (D) a polymer resin having a mass average molecular weight (Mw) of 6000 to 100000. The film has a melt viscosity at 120° C. of 100 Pa·s or less, and a melt viscosity at 120° C., after heating at 260° C. or more for 5 to 90 seconds, of 200 Pa·s or less, the epoxy resin of the component (A) has an epoxy equivalent weight of 220 to 340, the component (B) is included in an amount of 6 to 27 parts by mass relative to 100 parts by mass of the component (A), the component (C) is included in an amount of 20 to 65 parts by mass relative to 100 parts by mass in total of the components, and a content ratio ((A):(D)) between the component (A) and the component (D) is 99:1 to 65:35.

The pre-applied semiconductor sealing film for curing under pressure atmosphere according to the present invention preferably has a melt viscosity at 120° C. of 100 Pa·s or less. Also, the pre-applied semiconductor sealing film for curing under pressure atmosphere according to the present invention preferably has a melt viscosity increase rate at 120° C. of 50% or less after heated at 260° C. or more for 5 to 90 seconds.

In the pre-applied semiconductor sealing film for curing under pressure atmosphere according to the present invention, the high molecular weight resin of the component (D) is preferably a phenoxy resin having a bisphenol F structure.

In the pre-applied semiconductor sealing film for curing under pressure atmosphere according to the present invention, the silica filler of the component (C) preferably has an average particle size of 1 μm or less.

Also, the present invention provides a cured product of the pre-applied semiconductor sealing film for curing under pressure atmosphere according to the present invention.

Furthermore, the present invention provides a semiconductor device including the pre-applied semiconductor sealing film for curing under pressure atmosphere according to the present invention.

Effects of the Invention

The pre-applied semiconductor sealing film for curing under pressure atmosphere according to the present invention exhibits a high void suppressing effect when used for pressure mounting, and is therefore suitable as an NCF for pressure mounting.

DESCRIPTION OF THE EMBODIMENTS

Hereinafter, the present invention will be described in detail.

The pre-applied semiconductor sealing film for curing under pressure atmosphere according to the present invention (hereinafter, described as an NCF for pressure mounting) includes (A) a solid epoxy resin, (B) a specific aromatic amine described later, (C) a silica filler, and (D) a specific polymer resin described later.

(A) Solid Epoxy Resin

The solid epoxy resin of the component (A) primarily contributes to the adhesiveness of the NCF for pressure mounting according to the present invention.

As described herein, the solid epoxy resin indicates an epoxy resin which is solid at normal temperature. When the solid epoxy resin is used as the component (A), a film forming ability can be imparted.

The solid epoxy resin of the component (A) can be selected from a wide range of epoxy resins which are solid at normal temperature. Specific examples of such epoxy resins may include bisphenol A type epoxy resin, bisphenol S type epoxy resin, naphthalene type epoxy resin, phenol novolac type epoxy resin, phenol aralkyl type epoxy resin, cresol novolac type epoxy resin, biphenyl type epoxy resin, biphenyl novolac type epoxy resin, biphenyl aralkyl type epoxy resin, triphenylmethane type epoxy resin, and dicyclopentadiene type epoxy resin.

Among these, biphenyl aralkyl type epoxy resin, phenol aralkyl type epoxy resin, and dicyclopentadiene type epoxy resin are preferable, because of their excellent heat resistance, adherence, and reliability.

It is noted that one of the above-described epoxy resins can be used as the solid epoxy resin of the component (A). Alternatively, two or more thereof may be used in combination.

The solid epoxy resin of the component (A) has an epoxy equivalent weight of 220 to 340, from a viewpoint of melt viscosity adjustment and reactivity. When the epoxy equivalent weight is less than 220, the NCF is cured when a pressure oven process (pressure heating) is performed. Therefore, voids cannot be suppressed. When the epoxy equivalent weight is more than 340, the melt viscosity at 120'C becomes more than 100 Pa·s. Therefore, voids cannot be suppressed even when mounting by a pressure oven process is performed.

The epoxy equivalent weight of the solid epoxy resin of the component (A) is preferably 220 to 310, more preferably 225 to 290.

The solid epoxy resin of the component (A) has a mass average molecular weight (Mw) of preferably 500 to 3000, more preferably 750 to 2500.

(B) Aromatic Amine

The aromatic amine of the component (B) is liquid at room temperature, and contains at least one of structures represented by formulae 1 and 2 below.

[Chemical Formula 3]

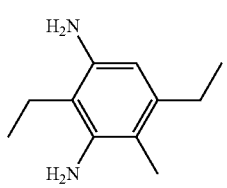

(Formula 1)

[Chemical Formula 4]

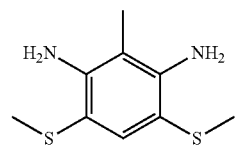

(Formula 2)

Since the aromatic amine of the component (B) is liquid at room temperature, the NCF for pressure mounting has appropriate toughness.

Also, since the aromatic amine of the component (B) contains at least one of structures represented by the above-described formulae 1 and 2, the melt viscosity at 120° C. and the melt viscosity at 120° C. after heating at 260° C. or more for 5 to 90 seconds can be adjusted such that the later-described conditions are satisfied.

The aromatic amine of the component (B) may contain one or both of the structures represented by the above-described formulae 1 and 2.

From a viewpoint of toughness, melt viscosity adjustment, and reactivity, the aromatic amine of the component (B) is included in an amount of 6 to 27 parts by mass, more preferably 14 to 26 parts by mass, relative to 100 parts by mass of the solid epoxy resin of the component (A).

(C) Silica Filler

The silica filler of the component (C) is added for a purpose of improving the reliability of a semiconductor package mounted with the NCF for pressure mounting.

From a viewpoint of the film forming property and transparency of the NCF for pressure mounting, the silica filler of the component (C) is included in an amount of 20 to 65 parts by mass relative to 100 parts by mass in total of the components of the NCF for pressure mounting. When the content of the component (C) is less than 20 parts by mass, the reliability of a semiconductor package mounted with the NCF for pressure mounting decreases. When the content of the component (C) is more than 65 parts by mass, the film forming property and transparency of the NCF for pressure mounting decrease.

The content of the component (C) relative to 100 parts by mass in total of the components of the NCF for pressure mounting is The silica filler of the component (C) has an average particle size of preferably 1 μm or less, more preferably 0.5 μm or less, for film smoothness, film transparency, or reduced chip damage.

As the silica filler of the component (C), a silica filler which has been surface-treated with a silane coupling agent or the like may be used.

(D) Polymer Resin

The polymer resin of the component (D) is a film forming agent. This polymer resin contributes to the toughness of the NCF for pressure mounting. The polymer resin of the component (D) has a mass average molecular weight of 6000 to 100000. When the polymer resin of the component (D) has an Mw of less than 6000, a film forming property deteriorates. On the other hand, when the Mw of the polymer resin of the component (D) is more than 100000, the melt viscosity at 120° C. and the melt viscosity at 120° C. after heated at 260° C. or more for 5 to 90 seconds increase. Therefore, the later-described conditions cannot be satisfied. As a result, when a pressure oven process (pressure heating) is performed, voids cannot be suppressed.

The polymer resin of the component (D) is preferably a resin which does not contain crystal nuclei, from a viewpoint of the transparency of the NCF for pressure mounting.

The polymer resin of the component (D) is preferably phenoxy resins. Especially, a phenoxy resin having a bisphenol F type structure is more preferable.

The content ratio of the polymer resin of the component (D), in terms of a mass ratio ((A):(D)) relative to the solid epoxy resin of the component (A), is 99:1 to 65:35. When the content ratio of the component (D) is excessively low, a film forming property deteriorates. When the content ratio of the component (D) is excessively high, the melt viscosity at 120° C. and the melt viscosity at 120° C. after heated at 260° C. or more for 5 to 90 seconds increase. Therefore, the later-described conditions cannot be satisfied. As a result, voids cannot be suppressed when a pressure oven process (pressure heating) is performed.

The NCF for pressure mounting according to the present invention may further include the following components as optional components.

(Liquid Epoxy Resin)

The NCF for pressure mounting according to the present invention may include liquid epoxy resin for a purpose of viscosity adjustment. In the present invention, liquid epoxy resin indicates an epoxy resin which is liquid at normal temperature. Specific examples of the liquid epoxy resin include a bisphenol A type epoxy resin and a bisphenol F type epoxy resin.

When a liquid epoxy resin is to be included, attention needs to be paid to the impurity concentration of the liquid epoxy resin. Also, when the content of the liquid epoxy resin is excessively high, fluidity or flexibility is imparted to the NCF for pressure mounting. As a result, handleability decreases. Therefore, attention needs to be paid so that the content of the liquid epoxy resin is not excessively high.

(Coupling Agent)

The NCF for pressure mounting according to the present invention may include a coupling agent for a purpose of improving adherence to an IC chip or a substrate.

The coupling agent preferably includes an epoxy group or an (meth)acrylate group.

(Curing Accelerator)

The NCF for pressure mounting according to the present invention may include a curing accelerator for epoxy resin as necessary.

(Rheology Adjustment Agent)

The NCF for pressure mounting according to the present invention may include a rheology adjustment agent for a purpose of adjusting coating suitability or flowing suitability, as necessary.

(Dispersing Agent and Anti-Settling Agent)

The NCF for pressure mounting according to the present invention may include a dispersing agent or an anti-settling agent as necessary, for a purpose of improving the dispersibility of or preventing settling of the silica filler of the component (C) and a coloring agent of an optional component.

(Defoaming Agent)

The NCF for pressure mounting according to the present invention may include a defoaming agent as necessary, for a purpose of adjusting a defoaming property.

(Coloring Agent)

The NCF for pressure mounting according to the present invention may include a coloring agent as necessary, for a purpose of coloring.

(Surface Adjustment Agent)

The NCF for pressure mounting according to the present invention may include a surface adjustment agent as necessary, for a purpose of adjusting a surface state or wettability.

(Elastomers)

The NCF for pressure mounting according to the present invention may include elastomers as necessary, for a purpose of adjusting elastic moduli and stress.

(Manufacture of NCF for Pressure Mounting)

The NCF for pressure mounting according to the present invention can be manufactured by a method known in the art. For example, a resin composition can be prepared as described below, by mixing the above-described components (A) to (D) as well as other components included as necessary using a thermal vacuum mixing kneader in the presence or absence of a solvent.

The above-described components (A) to (D) as well as other components included as necessary are dissolved at a prescribed solvent concentration, such that prescribed content ratios are achieved. Then, the prescribed amounts of the dissolved components are poured in a reaction tank which has been warmed to 10 to 80° C. Then, mixing at normal pressure is performed for 3 hours while the reaction tank is rotated at a rotational speed of 100 to 1000 rpm. Thereafter, mixing and stirring are further performed under vacuum (maximum 1 Torr) for 3 to 60 minutes.

The resin composition prepared by the above-described procedure can be diluted with a solvent to prepare a varnish. Subsequently, this varnish can be applied onto at least one surface of a support, and dried. Thereafter, there can be provided an NCF for pressure mounting attached to a support or an NCF for pressure mounting peeled from a support.

Examples of a solvent usable as a varnish may include ketones such as methyl ethyl ketone and methyl isobutyl ketone, aromatic solvents such as toluene and xylene, and high-boiling-point solvents such as dioctyl phthalate and dibutyl phthalate. The use amount of the solvent is not particularly limited. An amount used in the past can be set. The preferable use amount is 20 to 90 mass % relative to each of the components of the NCF for pressure mounting.

The support is not particularly limited. The support can be appropriately selected depending on a desired form in a method of manufacturing the NCF for pressure mounting. Examples of the support may include metal foils such as copper and aluminum and carrier films of resin such as polyester and polyethylene. When the NCF for pressure mounting according to the present invention is provided in the form of a film peeled from a support, the support is preferably subjected to a mold release treatment with a mold release agent such as a silicone compound.

The method for applying a varnish is not particularly limited. Examples of the applying method may include a slot die method, a gravure method, and a doctor coater method. The applying method is appropriately selected depending on a desired film thickness or the like. The applying is performed such that the thickness of a film formed after drying becomes a desired thickness. Those skilled in the art can derive such a thickness from a solvent content.

The drying conditions are not particularly limited. The drying conditions are appropriately designed depending on the type and amount of a solvent used for a varnish, the use amount of a varnish, the thickness of a coating, or the like. For example, drying can be performed at 60 to 100° C. under atmospheric pressure.

Next, characteristics of the NCF for pressure mounting according to the present invention will be described.

The NCF for pressure mounting according to the present invention has a melt viscosity at 120° C. of 100 Pa·s or less. Therefore, fluidity during chip mounting is favorable during pressure mounting. Thus, voids at this stage can be suppressed.

The NCF for pressure mounting according to the present invention preferably has a melt viscosity at 120° C. of 50 Pa·s or less.

The NCF for pressure mounting according to the present invention has a melt viscosity at 120° C. of 200 Pa·s or less, after heated at 260° C. or more for 5 to 90 seconds. Therefore, fluidity during reflow, which is performed after TCB or chip mounting, is favorable during pressure mounting. Thus, voids at this stage can be suppressed.

The NCF for pressure mounting according to the present invention preferably has a melt viscosity at 120° C. of 180 Pa·s or less, after heated at 260° C. or more for 5 to 90 seconds.

For the NCF for pressure mounting according to the present invention, a melt viscosity increase rate at 120° C. after heating at 260° C. or more for 5 to 90 seconds can be calculated as a ratio between the melt viscosity at 120° C. and the melt viscosity at 120° C. after heating at 260° C. or more for 5 to 90 seconds ((melt viscosity at 120° C. after heating at 260° C. or more for 5 to 90 seconds)/(melt viscosity at 120° C.)×100). From a viewpoint of favorable fluidity during reflow, which is performed after TCB or chip mounting, during pressure mounting, the melt viscosity increase rate is preferably 50% or less, more preferably 45% or less.

Next, a use procedure of the NCF for pressure mounting according to the present invention will be illustrated below.

When a semiconductor package is mounted with the NCF for pressure mounting according to the present invention, an NCF for pressure mounting having a desired shape is affixed to a substrate at a position where a semiconductor chip is to be mounted.

Alternatively, an NCF for pressure mounting having a desired shape can be affixed, using a laminator or the like, onto a wafer on which semiconductor circuits are formed, and thereafter individual chips can be cut out using a dicer or the like. The lamination conditions are not particularly limited. Conditions such as heating, pressurization, and decompression can be appropriately combined. In particular, for affixing an NCF to fine asperities without causing defects such as voids, the conditions are preferably a heating temperature of 40 to 120° C., a decompression degree of 1 hPa or less, and a pressure of 0.01 MPa or more.

Reflow can be performed by affixing an NCF for pressure mounting by lamination or the like, mounting a chip to a chip mounting position on a substrate, and thereafter heating to a prescribed temperature. The heating temperature during reflow is preferably 220 to 280° C. Next, curing under pressure and heat is performed using a pressure oven. The heating temperature during curing under pressure and heat is set to 165 to 185° C. The pressure is set to 0.2 to 1.0 MPa. Under these conditions, curing under pressure and heat is performed for 30 minutes or more and 4 hours or less.

After the NCF for pressure mounting has been affixed by lamination or the like, chip mounting is performed to a chip mounting position on a substrate by thermal compression bonding (TCB) using a flip chip bonder or the like. Thereafter, pressure mounting may be performed by the same procedure as above. TCB conditions are not particularly limited. TCB conditions can be appropriately selected depending on the size of a semiconductor chip, the material of a bump, the number of bumps, or the like.

Preferable conditions are a heating temperature of 50 to 300° C., a duration of 0.5 to 20 seconds, and a pressure of 5 to 450 N.

The semiconductor device according to the present invention is not particularly limited, as long as the NCF for pressure mounting according to the present invention is used when manufacturing the semiconductor device. A specific example of the semiconductor device according to the present invention may include a semiconductor device having a flip chip structure. A flip chip has a projection-like electrode called a bump. Through this electrode, the flip chip and an electrode of a substrate or the like are connected. Examples of the material of a bump may include solder, gold, and copper. Examples of the substrate to be connected to the flip chip may include a single- or multiple-layer organic substrate such as FR-4 and an inorganic substrate such as silicon, glass, and ceramics. An electrode to be used contains copper, or metal plating, tin plating, or a solder layer formed on copper. Examples of the semiconductor device having a flip chip structure may include memory devices such as a dynamic random access memory (DRAM), processor devices such as a central processing unit (CPU) and a graphics processing unit (GPU), light-emitting elements such as a light emitting diode (LED), and driver ICs used in a liquid crystal display (LCD) or the like.

EXAMPLES

Hereinafter, the present invention will be described in detail by examples. However, the present invention is not limited to these examples.

Examples 1 to 11 and Comparative Examples 1 to 9

Raw materials were mixed at blend ratios illustrated in the following tables. The mixture was dissolved and dispersed in a solvent such that the mixture has a concentration of 50 wt %. In this manner, a coating varnish was prepared. As the solvent, methyl ethyl ketone (manufactured by Wako Pure Chemical Industries, Ltd.) was used.

The coating varnish was applied onto a polyethylene terephthalate (PET) film coated with a mold release agent, such that the thickness after drying was about 20 μm. Thereafter, the polyethylene terephthalate (PET) film, which was coated with the coating varnish and treated with the mold release agent, was dried in a dryer at 80° C. for 10 minutes. In this manner, the solvent was removed. Accordingly, an NCF for pressure mounting with a thickness of 20 μm was prepared. It is noted that numerical values regarding compositions in the tables are indicated in parts by mass.

Components used when manufacturing NCFs for pressure mounting are as follows.

(A) Solid Epoxy Resin (A-1) Biphenyl aralkyl type epoxy resin, trade name NC3000, manufactured by Nippon Kayaku Co., Ltd., epoxy equivalent weight 265 to 285

(A-2) Phenol aralkyl type epoxy resin, trade name NC2000L, manufactured by Nippon Kayaku Co., Ltd., epoxy equivalent weight 229 to 244

(A'-1) Biphenyl type epoxy resin, trade name YX4000H, Japan Epoxy Resin Co., Ltd., epoxy equivalent weight 187 to 197

(A'-2) Bisphenol A type epoxy resin, trade name jER1001, manufactured by Mitsubishi Chemical Corporation, epoxy equivalent weight 187 to 197

(B) Liquid Aromatic Amine (B-1) Aromatic amine having a structure represented by formula (2) below, trade name EH105, manufactured by Adeka Corporation

[Chemical Formula 5]

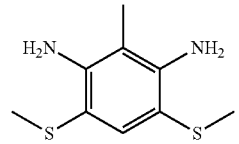

(Formula 2)

(B'1) Aromatic amine having a structure represented by formula (3) below, trade name HDAA, manufactured by Nippon Kayaku Co., Ltd.

[Chemical Formula 6]

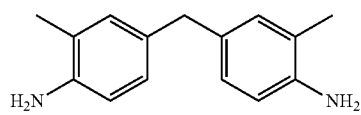

(3)

(B-2) Aromatic amine having a structure represented by formula (1) below trade name Ethacure 100, manufactured by Albemarle Corporation, Japan

[Chemical Formula 7]

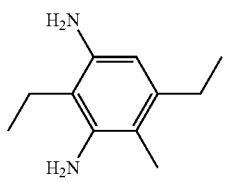

(Formula 1)

(B'2) Phenol novolac resin, trade name CR-953, manufactured by Aica SDK Phenol Co., Ltd.

(C) Silica Filler
 (C1) Average particle size 0.1 μm
 (C2) Average particle size 0.5 μm (D) Polymer Resin
 (D-1) Phenoxy resin having a bisphenol F type structure, trade name jER4250, manufactured by Mitsubishi Chemical Corporation, Mw60000
 (D-2) Phenoxy resin having a bisphenol F type structure, trade name FX316, manufactured by Tohto Kasei Co., Ltd., Mw45000
 (D'-1) Bisphenol A type epoxy resin, trade name jER1010, manufactured by Mitsubishi Chemical Corporation, Mw5500
 (D'-2) Polyvinyl formal, trade name Vinylec E, manufactured by Chisso Corporation, Mw126000

For each of the NCFs for pressure mounting prepared by the above-described procedure, the following evaluations were conducted.

(Film Forming Property)

A bending test was conducted by a procedure illustrated below.

The NCF for pressure mounting prepared by the above-described procedure was bended at 180°. Thereafter, presence or absence of cracks was checked.

Presence or absence of cracks in the film after a bending test was checked. When no cracks were found, it was rated Good. When cracks were found, it was rated Poor.

(Visibility)

The NCF for pressure mounting prepared by the above-described procedure, which was laminated (temperature 80° C., pressure 0.4 MPa) on a chip having a mark was visually evaluated. When the mark on the chip was observed, it was rated Good. When the mark on the chip could not be observed, it was rated Poor.

(120° C. Viscosity (Before 260° C.))

The lowest value measured using an ARES-G2 manufactured by TA Instruments, Inc. under the measurement conditions of an 8 mm aluminum parallel plate, a frequency of 1 Hz, and a strain of 0.0004 to 1000% was defined to be the melt viscosity at 120° C.

(120° C. Viscosity (after 260° C.))

After heating at 260° C. for 10 seconds, the melt viscosity at 120° C. was measured by the same procedure as above.

(Fluidity after Curing)

After heat curing under a pressure condition using a pressure oven, fluidity was evaluated by the following procedure. The heat curing under a pressure condition was performed at a pressure of 0.7 MPa and a temperature of 175° C. for 3 hours. According to indication by a needle, no fluidity was demonstrated.

(Voids after Pressure Oven)

After the heat curing under a pressure condition by the above-described procedure, presence or absence of voids was observed using an acoustic microscope. When a void area in an observation area was 5% or less, it was rated acceptable. When a void area was more than 5%, it was rated unacceptable.

(Reliability (Pressure Oven+Reflow))

After the heat curing under a pressure condition by the above-described procedure, reflow was performed by heating at a temperature of 255° C. Thereafter, presence or absence of voids was observed using an acoustic microscope. When a void area in an observation area was 5% or less, it was rated acceptable. When a void area was more than 5%, it was rated unacceptable.

It is noted that five samples, which were the same as each other, were produced. These five samples were evaluated for voids after a pressure oven process and reliability (pressure oven+reflow).

Results are illustrated below.

TABLE 1

| | Example 1 | Example 2 | Example 3 | Example 4 | Example 5 | Example 6 |
|---|---|---|---|---|---|---|
| (A1) | | 44.0 | | 46.0 | 44.0 | 44.0 | 46.0 |
| (A2) | | | 43.0 | | | | |
| (A'1) | | | | | | | |
| (A'2) | | | | | | | |

TABLE 1-continued

|  | Example 1 | Example 2 | Example 3 | Example 4 | Example 5 | Example 6 |
|---|---|---|---|---|---|---|
| (B1) | 10.0 | 11.0 |  | 10.0 | 10.0 | 10.0 |
| (B'1) |  |  |  |  |  |  |
| (B2) |  |  | 8.0 |  |  |  |
| (B'2) |  |  |  |  |  |  |
| (C1) | 40.0 | 40.0 | 40.0 |  | 40.0 | 20.0 |
| (C2) |  |  |  | 40.0 |  |  |
| (D1) | 6.0 | 6.0 | 6.0 | 6.0 |  |  |
| (D2) |  |  |  |  | 6.0 | 24.0 |
| (D'1) |  |  |  |  |  |  |
| (D'2) |  |  |  |  |  |  |
| Total | 100 | 100 | 100 | 100 | 100 | 100 |
| Film characteristics |  |  |  |  |  |  |
| Film forming property | Good | Good | Good | Good | Good | Good |
| Visibility | Good | Good | Good | Good | Good | Good |
| 120° C. Viscosity (before 260° C.) [Pa · s] | 31 | 25 | 22 | 24 | 16 | 49 |
| 120° C. Viscosity (after 260° C.) [Pa · s] | 31 | 28 | 24 | 29 | 20 | 51 |
| Fluidity after curing | No | No | No | No | No | No |
| Voids after pressure oven | 0/5 | 0/5 | 0/5 | 0/5 | 0/5 | 0/5 |
| Reliability (pressure oven + reflow) | 0/5 | 0/5 | 0/5 | 0/5 | 0/5 | 0/5 |
| Component (A) | 44.0 | 43.0 | 46.0 | 44.0 | 44.0 | 46.0 |
| Component (B) | 10.0 | 11.0 | 8.0 | 10.0 | 10.0 | 10.0 |
| Component (B) relative to Component (A) as 100 | 22.7 | 25.6 | 17.4 | 22.7 | 22.7 | 21.7 |
| Component (A) | 8.8 | 8.8 | 8.8 | 8.8 | 8.8 | 6.6 |
| Component (D) | 1.2 | 1.2 | 1.2 | 1.2 | 1.2 | 3.4 |
| Component (A) + Component (D) | 10.0 | 10.0 | 10.0 | 10.0 | 10.0 | 10.0 |

TABLE 2

|  | Example 7 | Example 8 | Example 9 | Example 10 | Example 11 |
|---|---|---|---|---|---|
| (A1) | 48.0 | 43.0 | 47.0 | 33.0 | 59.0 |
| (A2) |  |  |  |  |  |
| (A'1) |  |  |  |  |  |
| (A'2) |  |  |  |  |  |
| (B1) | 11.0 | 11.0 | 7.0 | 7.0 | 13.0 |
| (B'1) |  |  |  |  |  |
| (B2) |  |  |  |  |  |
| (B'2) |  |  |  |  |  |
| (C1) | 40.0 | 40.0 | 40.0 | 55.0 | 20.0 |
| (C2) |  |  |  |  |  |
| (D1) | 1.0 | 6.0 | 6.0 | 5.0 | 8.0 |
| (D2) |  |  |  |  |  |
| (D'1) |  |  |  |  |  |
| (D'2) |  |  |  |  |  |
| Total | 100 | 100 | 100 | 100 | 100 |
| Film characteristics |  |  |  |  |  |
| Film forming property | Good | Good | Good | Good | Good |
| Visibility | Good | Good | Good | Good | Good |
| 120° C. Viscosity (before 260° C.) [Pa · s] | 6 | 39 | 23 | 92 | 16 |
| 120° C. Viscosity (after 260° C.) [Pa · s] | 7 | 42 | 24 | 105 | 18 |
| Fluidity after curing | No | No | No | No | No |
| Voids after pressure oven | 0/5 | 0/5 | 0/5 | 0/5 | 0/5 |
| Reliability (pressure oven + reflow) | 0/5 | 0/5 | 0/5 | 0/5 | 0/5 |
| Component (A) | 48.0 | 43.0 | 47.0 | 33.0 | 59.0 |
| Component (B) | 11.0 | 11.0 | 7.0 | 7.0 | 13.0 |
| Component (B) relative to Component (A) as 100 | 22.9 | 25.6 | 14.9 | 21.2 | 22.0 |
| Component (A) | 9.8 | 8.8 | 8.9 | 8.7 | 8.8 |
| Component (D) | 0.2 | 1.2 | 1.1 | 1.3 | 1.2 |
| Component (A) + Component (D) | 10.0 | 10.0 | 10.0 | 10.0 | 10.0 |

TABLE 3

|  | Comparative Example 1 | Comparative Example 2 | Comparative Example 3 | Comparative Example 4 | Comparative Example 5 |
|---|---|---|---|---|---|
| (A1) | 27.0 |  | 51.0 |  |  |
| (A2) |  | 40.0 |  |  |  |
| (A'1) |  |  |  | 40.0 |  |
| (A'2) |  |  |  |  | 40.0 |
| (B1) | 8.0 |  | 2.0 |  |  |
| (B'1) |  | 13.0 |  | 13.0 | 13.0 |
| (B2) |  |  |  |  |  |
| (B'2) |  |  |  |  |  |
| (C1) | 40.0 | 40.0 | 40.0 | 40.0 | 40.0 |
| (C2) |  |  |  |  |  |
| (D1) | 25.0 | 7.0 | 7.0 | 7.0 | 7.0 |
| (D2) |  |  |  |  |  |
| (D'1) |  |  |  |  |  |
| (D'2) |  |  |  |  |  |
| Total | 100 | 100 | 100 | 100 | 100 |
| Film characteristics |  |  |  |  |  |
| Film forming property | Good | Good | Good | Good | Good |
| Visibility | Good | Good | Good | Good | Good |
| 120° C. Viscosity (before 260° C.) [Pa · s] | 1734 | 25 | 36 | 18 | 140 |
| 120° C. Viscosity (after 260° C.) [Pa · s] | 1753 | 140 | 37 | 172 | 145 |
| Fluidity after curing | No | No | Yes | No | No |
| Voids after pressure oven | 5/5 | 5/5 | 0/5 | 5/5 | 5/5 |
| Reliability (pressure oven + reflow) | 5/5 | 5/5 | 5/5 | 5/5 | 5/5 |
| Component (A) | 27.0 | 40.0 | 51.0 | 40.0 | 40.0 |
| Component (B) | 8.0 | 13.0 | 2.0 | 13.0 | 13.0 |
| Component (B) relative to Component (A) as 100 | 29.6 | 32.5 | 3.9 | 32.5 | 32.5 |
| Component (A) | 5.2 | 8.5 | 8.8 | 8.5 | 8.5 |
| Component (D) | 4.8 | 1.5 | 1.2 | 1.5 | 1.5 |
| Component (A) + Component (D) | 10.0 | 10.0 | 10.0 | 10.0 | 10.0 |

TABLE 4

|  | Comparative Example 6 | Comparative Example 7 | Comparative Example 8 | Comparative Example 9 |
|---|---|---|---|---|
| (A1) | 36.0 | 44.0 | 44.0 | 22.0 |
| (A2) |  |  |  |  |
| (A'1) |  |  |  |  |
| (A'2) |  |  |  |  |
| (B1) |  | 10.0 | 10.0 | 5.0 |
| (B'1) |  |  |  |  |
| (B2) |  |  |  |  |
| (B'2) | 18.0 |  |  |  |
| (C1) | 40.0 | 40.0 | 40.0 | 70.0 |
| (C2) |  |  |  |  |
| (D1) | 6.0 |  |  |  |
| (D2) |  |  |  |  |
| (D'1) |  | 6.0 |  |  |
| (D'2) |  |  | 6.0 | 3.0 |
| Total | 100 | 100 | 100 | 100 |
| Film characteristics |  |  |  |  |
| Film forming property | Good | Poor | Good | Poor |
| Visibility | Good | Good | Good | Poor |
| 120° C. Viscosity (before 260° C.) [Pa · s] | 38 | 18 | 318 | 575 |
| 120° C. Viscosity (after 260° C.) [Pa · s] | 38 | 24 | 324 | 580 |
| Fluidity after curing | Yes | No | No | No |
| Voids after pressure oven | 0/5 | 0/5 | 5/5 | 5/5 |
| Reliability (pressure oven + reflow) | 5/5 | 0/5 | 5/5 | 5/5 |
| Component (A) | 36.0 | 44.0 | 44.0 | 22.0 |
| Component (B) | 0.0 | 10.0 | 10.0 | 5.0 |
| Component (B) relative to Component (A) as 100 | 0.0 | 22.7 | 22.7 | 22.7 |
| Component (A) | 8.6 | 8.8 | 8.8 | 8.8 |
| Component (D) | 1.4 | 1.2 | 1.2 | 1.2 |
| Component (A) + Component (D) | 10.0 | 10.0 | 10.0 | 10.0 |

Examples 1 to 11 were favorable in a film forming property, visibility, voids after a pressure oven process, and reliability (pressure oven+reflow). It is noted that in Example 2, the solid epoxy resin of the component (A) in Example 1 is changed. In Example 3, the liquid aromatic amine of the component (B) in Example 1 is changed. In Example 4, the particle size of the silica filler of the component (C) is changed. In Example 5, the polymer resin of the component (D) in Example 1 is changed. In Example 6, the blend ratio of the component (D) in Example 5 is changed. In Example 7, the blend ratio of the component (D) in Example 1 is changed. In Examples 8 and 9, the blend ratio of the component (B) relative to the component (A) in Example 1 is changed. In Examples 10 and 11, the blend ratio of the component (C) in Example 1 is changed. In Comparative Example 1, the blend ratio of the component (D) is high, and furthermore, melt viscosities at 120° C. (before 260° C. and after 260° C.) do not satisfy the conditions of the present invention. Comparative Example 1 was poor in voids after a pressure oven process and reliability (pressure oven+reflow). In Comparative Example 2, a liquid aromatic amine having a structure other than that of the present invention was used. Comparative Example 2 was poor in voids after a pressure oven process and reliability (pressure oven+reflow). In Comparative Example 3, the blend ratio of the component (B) is low. Comparative Example 3 exhibited fluidity after curing. In Comparative Example 4, a solid epoxy resin having a low epoxy equivalent weight was used. Comparative Example 4 was poor in voids after a pressure oven process and reliability (pressure oven+reflow). In Comparative Example 5, a solid epoxy resin having a high epoxy equivalent weight was used, and furthermore, the melt viscosity at 120° C. (before 260° C.) does not satisfy the conditions of the present invention. Comparative Example 5 was poor in voids after a pressure oven process and reliability (pressure oven+reflow). In Comparative Example 6, novolac phenolic resin was used instead of the component (B). Comparative Example 6 exhibited fluidity after curing. In Comparative Example 7, a polymer resin having a low Mw was used. Comparative Example 7 was poor in a film forming property. In Comparative Example 8, a polymer resin having a high Mw was used, and furthermore, melt viscosities at 120° C. (before 260° C. and after 260° C.) do not satisfy the conditions of the present invention. Comparative Example 8 was poor in voids after a pressure oven process and reliability (pressure oven+reflow). In Comparative Example 9, the blend ratio of the silica filler of the component (C) is high, and melt viscosities at 120° C. (before 260° C. and after 260° C.) do not satisfy the conditions of the present invention. Comparative Example 9 was poor in all evaluation items.

The invention claimed is:

1. A pre-applied semiconductor sealing film for curing under pressure atmosphere, comprising:
   (A) a solid epoxy resin;
   (B) an aromatic amine which is liquid at room temperature and includes a structure represented by formula 2 below;

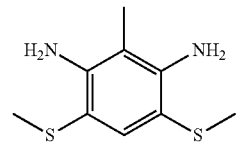

(Formula 2)

(C) a silica filler; and
   (D) a polymer resin having a mass average molecular weight (Mw) of 6000 to 100000,
   wherein the film has a melt viscosity at 120° C. of 100 Pa·s or less, and
   a melt viscosity at 120° C., after heating at 260° C. or more for 5 to 90 seconds, of 200 Pa·s or less,
   the epoxy resin of the component (A) has an epoxy equivalent weight of 220 to 340,
   the component (B) is included in an amount of 14 to 26 parts by mass relative to 100 parts by mass of the component (A),
   the component (C) is included in an amount of 20 to 65 parts by mass relative to 100 parts by mass in total of the components, and
   a content ratio ((A):(D)) between the component (A) and the component (D) is 99:1 to 65:35.

2. The pre-applied semiconductor sealing film for curing under pressure atmosphere according to claim 1, having a melt viscosity at 120° C. of 100 Pa·s or less and a melt viscosity increase rate at 120° C., after heated at 260° C. or more for 5 to 90 seconds, of 50% or less.

3. The pre-applied semiconductor sealing film for curing under pressure atmosphere according to claim 1, wherein the polymer resin of the component (D) is a phenoxy resin having a bisphenol F structure.

4. The pre-applied semiconductor sealing film for curing under pressure atmosphere according to claim 1, wherein the silica filler of the component (C) has an average particle size of 1 μm or less.

5. A cured product of the pre-applied semiconductor sealing film for curing under pressure atmosphere according to claim 1.

6. A semiconductor device, wherein the pre-applied semiconductor sealing film for curing under pressure atmosphere according to claim 1 is used.

* * * * *